United States Patent
Schwarzl

(12) 
(10) Patent No.: US 6,495,873 B2
(45) Date of Patent: Dec. 17, 2002

(54) MAGNETORESISTIVE ELEMENT AND USE THEREOF AS A MEMORY ELEMENT IN A MEMORY CELL CONFIGURATION

(75) Inventor: Siegfried Schwarzl, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/801,210

(22) Filed: Mar. 7, 2001

(65) Prior Publication Data

US 2001/0024388 A1 Sep. 27, 2001

Related U.S. Application Data

(63) Continuation of application No. PCT/DE99/01942, filed on Jul. 1, 1999.

(30) Foreign Application Priority Data

Sep. 7, 1998 (DE) .......................... 198 40 823

(51) Int. Cl.⁷ ............................................ H01L 31/062
(52) U.S. Cl. ...................................................... 257/295
(58) Field of Search ........................ 365/158; 257/295, 257/761

(56) References Cited

U.S. PATENT DOCUMENTS

| | | | | |
|---|---|---|---|---|
| 4,918,655 A | * | 4/1990 | Daughton | 365/173 |
| 4,945,397 A | | 7/1990 | Schuetz | 257/421 |
| 5,541,868 A | | 7/1996 | Prinz | 365/98 |
| 5,587,943 A | * | 12/1996 | Torok et al. | 365/158 |
| 5,594,933 A | | 1/1997 | Hayashi et al. | 428/546 |
| 5,667,879 A | * | 9/1997 | Haji-Sheikh | 428/209 |
| 5,804,250 A | * | 9/1998 | Yang | 427/130 |
| 5,956,267 A | * | 9/1999 | Hurst et al. | 365/158 |
| 5,965,942 A | * | 10/1999 | Itoh et al. | 257/761 |
| 6,111,722 A | * | 8/2000 | Fukuzawa et al. | 360/113 |
| 6,111,729 A | * | 8/2000 | Kamiguchi et al. | 360/324.1 |

FOREIGN PATENT DOCUMENTS

| | | |
|---|---|---|
| DE | 198 40 823 C1 | 7/2000 |
| EP | 0 674 327 A1 | 9/1995 |

OTHER PUBLICATIONS

Inderjeet Kaur et al.: "Fundamentals of Grain and Interphase Boundary Diffusion", 2nd Revised Edition, published by Ziegler Press, Germany, 1989, pp. 16–26, p. 287, 316–318; Unknown Month.

D. Widmann et al.: „Technologie hochintegrierter Schaltungen (Technology of High Integrated Circuits), vol. 2, published by Springer Verlag, Germany,1996, pp. 57–62; Unknown Month.

Stefan Mengel: „Technolgieanalyse Magnetismus, Band 2, XMR–Technologien (Technology Analysis Magnetism), vol. 2, XMR–Technolgies, published by VDI Technologiezentrum Physikalische Technologien, Aug. 1997, pp. 4–80.

(List continued on next page.)

Primary Examiner—Hoai Ho
Assistant Examiner—Tu-Tu Ho
(74) Attorney, Agent, or Firm—Laurence A. Greenberg; Werner H. Stemer; Gregory L. Mayback

(57) ABSTRACT

In a magnetoresistive element, a non-magnetic layer element is disposed between a first ferromagnetic layer element and a second ferromagnetic layer element. The non-magnetic layer element consists of a material that exhibits a diffusion barrier effect in a temperature range that is required in the production of the magnetoresistive element, and that does not itself diffuse into the adjacent ferromagnetic layer elements. The magnetoresistive element is suitable both as a sensor element and as a memory element of a memory cell configuration.

4 Claims, 1 Drawing Sheet

OTHER PUBLICATIONS

Inderjeet Kaur et al.: "Handbook Of Grain And Interphase Boundary Diffusion Data", vol. 1, Ziegler Press, Stuttgart 1989, p. 220 Unknown Month.

Inderjeet Kaur et al.: "Handbook Of Grain And Interphase Boundary Diffusion Data", Ziegler Press, Stuttgart 1989, vol. 2, pp. 776, 952–953, 996–998 Unknown Month.

W. Heywang et al. (ed.): "Halbleiter–Elektronik" [semiconductor electronics], vol. 19, p. 223, Year Month Unknown.

D.D. Tang et al.: "An IC process compatible Nonvolatile Magnetic RAM", IEDM 95, pp. 997–998 (1995, Unknown Month).

S. Tehrani et al.: "High Density Nonvolatile Magnetoresistive RAM", IEDM 96, pp. 193–196 (1996, Unknown Month).

* cited by examiner

MAGNETORESISTIVE ELEMENT AND USE THEREOF AS A MEMORY ELEMENT IN A MEMORY CELL CONFIGURATION

CROSS-REFERENCE TO RELATED APPLICATION

This application is a continuation of copending International Application No. PCT/DE99/01942, filed Jul. 1, 1999, which designated the United States.

BACKGROUND OF THE INVENTION

FIELD OF THE INVENTION

Magnetoresistive elements are increasingly being used as sensor elements or as memory elements for memory cell configurations, what are known as MRAMs (see S. Mengel Technologieanalyse Magnetismus; Vol. 2, XMR Techologien: August 1997).

The term magnetoresistive element is understood to refer to a structure that has at least two ferromagnetic layers with one non-magnetic layer disposed between them. It is possible to distinguish among GMR elements, TMR elements, and CMR elements, depending on the construction of the layer structure.

The term GMR element is a term of art that is used for layer structures that comprise at least two ferromagnetic layers and one intermediate non-magnetic conductive layer and that exhibit what is known as the GMR (Giant Magnetoresitance) effect. The GMR effect refers to the fact that the electrical resistance of the GMR element depends on whether the magnetizations in the two ferromagnetic layers are aligned parallel or anti-parallel. The GMR effect is large compared to what is known as the AMR (Anisotropic Magnetoresistance) effect. AMR effect refers to the fact that the resistance in the magnetized conductors parallel and perpendicular to the magnetization direction differs. The AMR effect is a matter of a volume effect that occurs in single ferromagnetic layers.

The term TMR element is a term of art used for tunneling magnetoresistance layer structures that have at least two ferromagnetic layers and one intervening insulating non-magnetic layer. The insulating layer is so thin that a tunneling current arises between the two ferromagnetic layers. These layer structures also exhibit a magnetoresistive effect that is produced by a spin-polarized tunnel current through the insulating non-magnetic layer that is disposed between the two ferromagnetic layers. In this case, also, the electrical resistance of the TMR element depends on whether the magnetizations in the two ferromagnetic layers are aligned parallel or antiparallel. The relative change in resistance equals approximately 6 to 30 percent.

An additional magnetoresistance effect is the so-called colossal magnetoresistance effect (CMR effect) owing to its size (relative change of resistance of from 100 to 400 percent at room temperature). The CMR effect requires a high magnetic field for switching between the magnetization states as a result of its high coercive forces.

It has been suggested (e.g. S. Tehrani, IEDM 96-193 and D. D. Tang, IEDM 95-997) that GMR elements be used as memory elements in a memory cell configuration. The memory elements are connected in series via read lines. Word lines that extend perpendicular thereto are insulated against both the read lines and the memory elements. Signals that are applied to the word lines produce a magnetic field by means of the current flowing in the word line, which field influences the underlying memory elements given adequate strength. The writing of information is accomplished using X/Y lines which cross above the memory location that is to be written. They are charged with signals that produce a magnetic field at the junction which is sufficient for the magnetic reversal. In this process, the magnetization direction in one of the two ferromagnetic layers is reversed. On the other hand, the magnetization direction in the other of the two ferromagnetic layers remains unchanged. The maintaining of the magnetization direction in the latter ferromagnetic layer is accomplished with the aid of an adjacent antiferromagnetic layer, which maintains the magnetization direction, or by increasing the switching threshold for this ferromagnetic layer using a different material or a different dimensioning, for instance layer thickness, than the first ferromagnetic layer.

U.S. Pat. No. 5,541,868 discloses annular memory elements based on the GMR effect. The memory element comprises a stack having at least two annular ferromagnetic layer elements and one intermediate non-magnetic conductive layer element. The ferromagnetic layer elements differ in their material composition. One of the ferromagnetic layer elements is magnetically hard; the other is magnetically softer. To write the information, the magnetization direction in the magnetically softer layer element is switched, while the magnetization direction in the magnetically harder layer element remains unchanged.

With a view to using magnetoresistive elements on a large scale, for instance as integrated magnetoresistive memory cell configurations (known as MRAMs) or as integrated sensor arrangements, it is necessary to integrate magnetoresistive elements into a semiconductor processing technique. In semiconductor processing, particularly in the manufacturing of semiconductor configurations in what is known as the back end process on wafer planes, also known as BEOL (Back End of Line), temperatures of up to at least 450° C. arise, to which the magnetoresistive elements are also exposed (see D. Widmann, Technologie integrierter Schaltungen, Springer 1996: 58). In that temperature range, owing to the diffusion mobility of the elements contained in magnetoresistive layer systems, such as Fe, Co, Ni, Cu, and so on, diffusion can be expected to alter the characteristics of the ferromagnetic layer elements in such a way that magnetoresistive elements having ferromagnetic layer elements of different material compositions are no longer functional. The undesirable diffusion causes a change in the material composition in the boundary surface zones, which adversely affects the spin-dependent electron transport on which the magnetoresistance effects in these elements are based. Therefore, even slight diffusion-related material migrations with a reach of from 1 to 5 nm beyond these boundary surfaces should be expected to lead to significant changes of the magnetic and electrical characteristics. Diffusion lengths of only a few nanometers can already lead to completely altered boundary surface characteristics, which lead to characteristic drifts or even to total failure of the magnetoresistive elements (see Kaur and Gust, Fundamentals of Grain and Interphase Boundary Diffusion, Ziegler Press, Stuttgart (1989):16–26, 287, 316 to 318, and Kaur, Gust, and Kozma, Handbook of Grain and Interphase Boundary Data, Vol. 1 and 2, Ziegler Press, Stuttgart (1989): 8–13, 220–224, 403, 515, 528, 530, 776, 952 to 953, 966 to 998).

The problem of integrating magnetoresistive elements into a semiconductor processing technique and the possible difficulties thereof have not been discussed in the literature hitherto.

SUMMARY OF THE INVENTION

The object of the present invention is to provide a magnetoresistive element which overcomes the above-noted deficiencies and disadvantages of the prior art devices and methods of this general kind, and which can be produced in the context of a semiconductor processing technique.

With the above and other objects in view there is provided, in accordance with the invention, a magnetoresistive element, comprising:

a first ferromagnetic layer element, a second ferromagnetic layer element, and a non-magnetic layer element disposed between the first ferromagnetic layer element and the second ferromagnetic layer element;

the non-magnetic layer element containing a material exhibiting a diffusion barrier effect in a temperature range between 20° C. and 450° C. and being substantially non-diffusible into the first and second ferromagnetic layer elements; and the layer elements being produced by a semiconductor processing technique.

The magnetoresistive element comprises a first ferromagnetic layer element, a non-magnetic layer element, and a second ferromagnetic layer element, with the non-magnetic layer element being disposed between the first and second ferromagnetic layer elements. The non-magnetic layer element exhibits a diffusion barrier effect in a temperature range that is required in the production of the magnetoresistive element. In the production process, the magnetoresistive element is exposed to temperatures in this range.

In the inventive magnetoresistive element, a change in the characteristics of the ferromagnetic layer elements due to temperature loads that arise in processing is prevented by forming the non-magnetic layer element from a material that has a diffusion barrier effect and that does not itself diffuse into the adjacent ferromagnetic layer elements.

The non-magnetic layer element is preferably made of a material that exhibits the diffusion barrier effect in the temperature range from 20° C. to 450° C. This guarantees that temperature loads that arise in the silicon processing technique during the production of an arrangement comprising the magnetoresistive element, which can equal up to 450° C. in the processing of metallization systems, do not give rise to diffusions among the first ferromagnetic layer element, the second ferromagnetic layer element, and the non-magnetic layer element.

In accordance with an additional feature of the invention, the non-magnetic layer element contains the following materials:

at least one of the elements Ti, W, Mo;
a nitride of these elements;
a silicide of the elements Ti, Ta, W, Mo;
a boride of these elements; or
an alloy of at least two of these elements.

It is within the scope of the invention that the non-magnetic layer element contains at least one of the following elements: Ti, Ta, W, Nb, and Mo, with or without additions of N, Si or B.

The thickness of the non-magnetic layer element is preferably between 2 and 4 nm.

The first ferromagnetic layer element and the second layer element each contain at least one of the following elements: Fe, Ni, Co, Gd, and Dy. The thicknesses of the first and second ferromagnetic layer elements are preferably between 2 and 20 nm. The cross-sections of the ferromagnetic layer elements are random parallel to the layer planes; in particular, they can be round, oval, angular or annular.

In accordance with an added feature of the invention, the first ferromagnetic layer element and the second ferromagnetic layer element have mutually different material compositions. They may also differ with respect to their dimensions.

The magnetoresistive element is suitable both as a sensor element and as a memory element of a memory cell configuration.

Other features which are considered as characteristic for the invention are set forth in the appended claims.

Although the invention is illustrated and described herein as embodied in a magnetoresistive element and use thereof as a memory element in a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
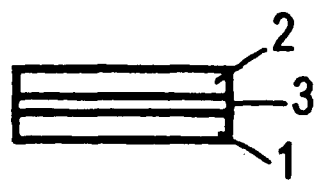
FIG. 1 is a sectional view taken through a magnetoresistive element.

Referring now to the figures of the drawing in detail and first, particularly, to FIG. 1 thereof, a magnetoresistive element comprises a first ferromagnetic layer element 1, which is made of Fe, Ni, Co, Gd, Dy or alloys thereof; a non-magnetic layer element 3, which is made of Ti, Ta, W, Nb, and/or Mo with or without additions of N, Si or B; and a second ferromagnetic layer element 2, which is made of Fe, Ni, Co, Gd, Ry or alloys thereof. The non-magnetic layer 3 is sandwiched between the magnetic layers 1 and 2. The first ferromagnetic layer element 1 comprises a substantially rectangular cross-section with dimensions of approx. 100 nm×150 nm and a thickness of approx. 20 nm. The second ferromagnetic layer element comprises a substantially rectangular cross-section with dimensions of 100 nm×150 nm and a thickness of approx. 5 nm. The non-magnetic layer element 3 likewise comprises a substantially rectangular cross-section with dimensions of 100 nm×150 nm and a thickness of from 2 to 4 nm. In this magnetoresistive element, diffusion is effectively prevented up to a temperature of 450° C. by the non-magnetic layer element 3 that is made of Ti, Ta, W, Nb, and/or Mo with or without additions of N, Si, or B.

Figure 2:
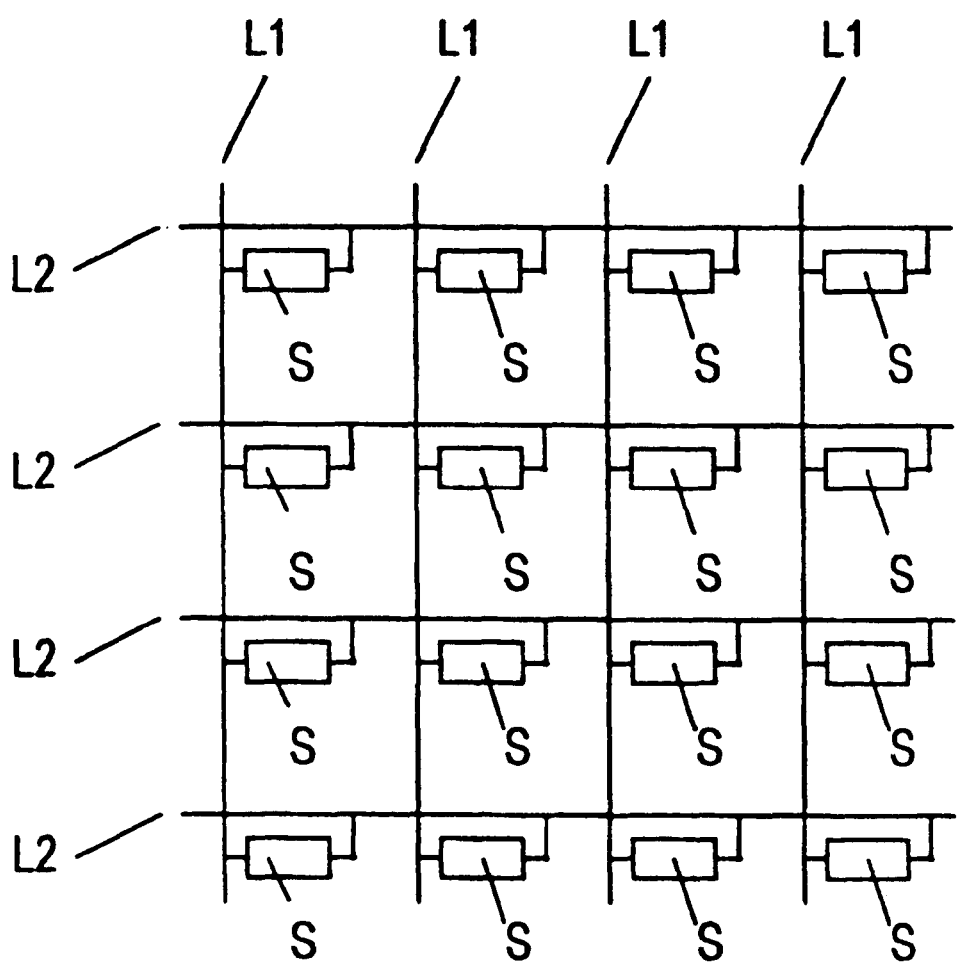
FIG. 2 is a diagrammatic plan view of a memory cell configuration.

To build a memory cell configuration that comprises magnetoresistive elements that are constructed as represented in FIG. 1 as memory elements S, the memory elements S are arranged in a grid array. Each memory element S is connected between a first line L1 and a second line L2. The first lines L1 extend parallel to one another and cross the second lines L2, which also run parallel to each other (see FIG. 2). The first lines L1 may be referred to as column lines and the second lines L2 may be referred to as row lines. In the writing of a memory element S, respective currents flowing over an appertaining line L1 and an appertaining second line L2 are of such a magnitude as to produce a sufficient magnetic field for switching the magnetization direction of the second ferromagnetic layer element at the intersection of the first and second lines L1, L2, where the memory element is disposed. The magnetic field which is active at the respective junction is a superposition of the magnetic field that is induced by the current flow in the first line L1 and the magnetic field that is induced by the current flow in the second line L2.

In the memory cell configuration, the resistance value of the magnetoresistive elements that corresponds to the parallel orientation of the magnetization direction in the first ferromagnetic layer element relative to that in the second ferromagnetic layer element is assigned a first logical value, and the resistance value that corresponds to the antiparallel orientation of the magnetization direction in the first ferromagnetic layer element relative to that of the second ferromagnetic layer element is assigned a second logical value.

I claim:

1. A magnetoresistive element, comprising:

a first ferromagnetic layer element;

a second ferromagnetic layer element; and a non-magnetic layer element disposed between said first ferromagnetic layer element and said second ferromagnetic layer element;

said non-magnetic layer element containing a material exhibiting a diffusion barrier effect in a temperature range between 20° C. and 450° C. and being substantially non-diffusible into said first and second ferromagnetic layer elements;

said layer elements being produced by a semiconductor processing technique; and said non-magnetic layer element containing a material selected from the group consisting of at least one of the elements selected from the group consisting of Ti, W, Mo; a nitride of the elements selected from the group consisting of Ti, W, and Mo; a silicide of the elements selected from the group consisting of Ti, Ta, W, and Mo; a boride of the elements selected from the group consisting of Ti, Ta, W, and Mo; and an alloy of at least two elements selected from the group consisting of Ti, Ta, W, and Mo.

2. The magnetoresistive element according to claim 1, wherein said first ferromagnetic layer element and said second ferromagnetic layer element have mutually different material compositions.

3. The magnetoresistive element according to claim 1, wherein each of said first ferromagnetic layer element and said second ferromagnetic layer element contains at least one of the elements selected from the group consisting of Fe, Ni, Co, Gd, and Dy.

4. A memory cell configuration, comprising a plurality of magnetoresistive elements according to claim 1 arranged and connected as memory elements in a memory array.

* * * * *